(12) United States Patent
Myers et al.

(10) Patent No.: US 6,549,590 B2
(45) Date of Patent: *Apr. 15, 2003

(54) CURRENT-CONTROLLED CARRIER TRACKING FILTER FOR IMPROVED SPURIOUS SIGNAL SUPPRESSION

(75) Inventors: Brent A. Myers, Palm Bay, FL (US); Paul J. Godfrey, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 09/855,332

(22) Filed: May 15, 2001

(65) Prior Publication Data

US 2001/0021230 A1 Sep. 13, 2001

Related U.S. Application Data

(63) Continuation of application No. 09/334,998, filed on Jun. 17, 1999, now Pat. No. 6,233,293, which is a continuation of application No. 08/606,958, filed on Feb. 23, 1996, now Pat. No. 5,953,379.

(51) Int. Cl.[7] .............................................. H04L 27/06
(52) U.S. Cl. ........................ 375/344; 375/362; 331/17; 327/553
(58) Field of Search ................................ 375/344, 324, 375/343, 362; 327/552, 553, 558; 331/17, 74; 341/143

(56) References Cited

U.S. PATENT DOCUMENTS

| | | | |
|---|---|---|---|
| 4,737,968 A | 4/1988 | Norton et al. | ................. 375/60 |
| 5,117,205 A | 5/1992 | Natuta | ....................... 331/117 |
| 5,345,119 A | 9/1994 | Khoury | ...................... 307/521 |
| 5,396,188 A | 3/1995 | Aoki | ........................... 327/552 |
| 5,430,337 A | 7/1995 | Castello et al. | ............... 327/65 |
| 5,489,873 A | 2/1996 | Kamata et al. | .............. 327/558 |
| 5,625,317 A | 4/1997 | Deveirman | .................. 327/353 |
| 5,726,600 A * | 3/1998 | Raghavan et al. | .......... 327/553 |
| 5,729,230 A * | 3/1998 | Jensenet et al. | ............ 341/143 |
| 5,736,903 A * | 4/1998 | Myers et al. | ................. 331/17 |
| 5,960,183 A * | 9/1999 | Toumazou et al. | ..... 395/500.04 |

FOREIGN PATENT DOCUMENTS

EP  0 445 298 A1  6/1991  ............ H03B/5/20

OTHER PUBLICATIONS

"Design of Continuous–Time Fully Integrated Filters: A Review", by Prof. R. Schaumann, *IEEE Proceedings*, vol. 136, Pt. T. No. 4, Aug., 1989, pp. 184–190.
"A 4–MHz CMOS Continuout–Time Fileter with On–Chip Automatic Tuning", by Fancois Krummenacher and Norbert Joehl; *IEEE Journal of Solid–State Circuits*, vol. 23, No. 3, Jun., 1998, pp 750–758.

* cited by examiner

*Primary Examiner*—Shuwang Liu
(74) *Attorney, Agent, or Firm*—Allen, Dyer, Doppelt Milbrath & Gilchrist, P.A.

(57) ABSTRACT

Spurious energy suppression for a data communication system is achieved without using a large order noise suppression filter, by means of a post-mixer tracking filter that contains a current-controlled MOSFET-implemented resistance for a transconductance-capacitance filter and an associated transconductance tuning stage. The MOSFET-implemented resistance is controlled by the same control current that establishes the output frequency. As a result, the cut-off frequency of the tracking filter is linearly proportional to the carrier and independent of absolute processing parameters and temperature.

20 Claims, 2 Drawing Sheets

CURRENT-CONTROLLED CARRIER TRACKING FILTER FOR IMPROVED SPURIOUS SIGNAL SUPPRESSION

This application is a continuation of application U.S. Ser. No. 09/334,998 filed on Jun. 17, 1999, now U.S. Pat. No. 6,233,293 B1, issued May 15, 2001, which is a continuation of U.S. Ser. No. 08/606,958 filed on Feb. 23, 1996, now U.S. Pat. No. 5,953,379 issued Sep. 14, 1999. The present invention relates in general to communication circuits, including continuous time integrated communication circuits, and is particularly directed to an improved on-chip, 'carrier-tracking' filter circuit, having a cut-off frequency that varies linearly with a control current supplied to a current-controlled oscillator, from which the carrier frequency to be tracked is derived.

FIELD OF THE INVENTION

BACKGROUND OF THE INVENTION

One of the requirements currently imposed (by the FCC) upon communication systems and networks is that they comply with very stringent spurious energy suppression standards. In today's digital communications environment, data signals (which have square rather than sinusoidal characteristics) are typically conditioned and modulated upon a higher carrier frequency (e.g., via emitter coupled logic circuitry (ECL)-based in-phase I and quadrature Q channels) where the data can be more readily transmitted.

Since the primary signal energy component of interest is located in the spectrum immediately surrounding the carrier center frequency, other spurious energy—typically the odd harmonics (multiples) of the original carrier frequency resulting from the modulation (multiplication or mixing) operation of such non-sinusoidal signals—must be removed, in order to avoid contaminating adjacent carrier channels that contain their own information energy components.

One way to remove such spurious energy is to apply the mixer output to a lowpass filter having a cutoff frequency that is slightly higher than the highest carrier frequency to be employed in a given communication system, such as a frequency-agile transceiver. Unfortunately, if the highest carrier frequency capable of being generated is close to the second or third harmonic of the lowest carrier frequency in the operating range of the system, the size (order) of the filter required to achieve sufficient unwanted energy suppression under all operating conditions is unacceptably large.

As a non-limiting example, in the case of conducting data communications over a television cable network, the required harmonic suppression filter may be an eight to twelve order filter. Such a large and complex filter is obviously impractical where cost and semiconductor silicon area are prime considerations in chip design. Moreover, such a large order filter has a higher group delay error, which can increase bit error rate.

Another technique is to add a filter pole to the carrier generator prior to the mixer. For a fixed carrier, adding a single pole is readily accomplished by simply adding a capacitor; however, in the case of a frequency-agile system, it is necessary to employ a plurality of capacitors, typically implemented as a programmable (controllably switched, binary weighted) capacitor array.

If the process employed to manufacture the integrated circuit architecture is a BiMOS process, MOSFET switches may be used to switch among the capacitors of the array. However, for a multiple channel system where there are a considerable number of potential carrier frequencies—requiring a separate capacitor for each carrier frequency, a binary-weighted capacitor array cannot be effectively employed, since the filter's cutoff frequency varies with the reciprocal of the value of the capacitor. As a consequence, if the cutoff frequency is to vary in a linear manner, the cutoff control capacitor must vary in a nonlinear fashion, which not only again leads to an unacceptably large and complex filter, but the required switch array introduces parasitic poles, which are not readily compensated.

SUMMARY OF THE INVENTION

In accordance with the present invention, the shortcomings of the prior art filter proposals described above are successfully remedied by a post-mixer carrier frequency-tracking filter that contains a current-controlled MOSFET-implemented resistance for a transconductance-capacitance filter and an associated transconductance tuning stage. The current-controlled MOSFET resistance-based filter mechanism has a transfer function which is established by an oscillator control current that controls the carrier frequency of interest.

The post-mixer carrier of the invention comprises a continuous time filter circuit, in particular a tunable $g_m/C$ filter, of the type commonly employed in high frequency telecommunication signal processing integrated circuit architectures. The fundamental building block of such a tunable $g_m/C$ filter is an integrator stage formed by combining a transconductance ($g_m$) stage with an integrating capacitor. By cascading multiple integrator stages, a transconductance-C ($g_m$-C) filter of any desired order may be realized, having a cutoff frequency $f_o$ that is effectively proportional to the ratio of $g_m$ to C.

The transfer functions of each of a tunable transconductance of the MOSFET-implemented resistance of a transconductance stage-capacitance filter and an associated transconductance tuning stage are effectively dependent upon the same oscillator control current that defines the output of a variable frequency synthesizer, which sources the carrier frequency of interest. In the modulation section of a transmitter device, this output carrier frequency and a baseband (data) signal are combined to produce a modulated carrier, which is then filtered by the carrier tracking filter.

The tunable transconductance of the transconductance stage-capacitance filter is referenced to a current mirror circuit, which replicates the control current for the variable synthesizer, and includes a differentially connected pair of matched bipolar transistors, each of which has an effective transconductance $g_m$. The base electrodes of the differentially connected bipolar transistor pair are coupled to receive complementary input voltages that are centered around a common mode reference voltage level, and have their emitters coupled in circuit with respective controlled (emitter degeneration) MOSFET-implemented resistors. The gate electrodes of the MOSFET-implemented resistors are coupled in common to receive a control voltage that is derived from the transconductance tuning network, which operates the MOSFETs in the linear portion of their $V_{DS}$–$I_{DS}$ characteristic.

The control voltage for the MOSFET-implemented resistors of the tunable transconductance stage is derived from a tuning network having a servo-loop connected, differential amplifier. A first input of the differential amplifier is coupled to a node between a fixed current source and a reference resistor, which is coupled in circuit with the emitter of a bipolar transistor. The fixed current source is preferably a PTAT reference current, so as to effectively eliminate temperature dependence. The current may be defined by the ratio of a voltage and a current-setting resistor comprised of the same resistor material as the reference resistor. A second input of the differential amplifier is coupled to a node between a mirrored current source, which supplies current having a magnitude that is a multiple (fractional or whole) of the oscillator control current and the source of a controlled MOSFET-implemented resistor that is coupled in circuit with the emitter of a bipolar transistor.

The bipolar transistors, to which the resistor inputs to the differential amplifier are coupled, are formed in the same integrated circuit chip as the tunable transconductance stage and are matched with its bipolar transistors. The controlled MOSFET-implemented resistor is configured identically to the MOSFET-implemented resistors of the tunable transconductance stage and has its gate electrode coupled to the output of the differential amplifier.

In operation, with a fixed current being supplied through the reference resistor to the first input of the differential amplifier and, with a mirrored, frequency synthesizer control current supplied through the MOSFET-implemented resistor to the second input of the differential amplifier, for a balanced servo loop condition, the two input voltages supplied to the respective inputs of the differential amplifier are equal.

Analysis reveals that the controlled resistance $R_m$ of each of the MOSFET-implemented resistors of the tunable transconductance stage is inversely proportional to the frequency synthesizer's control current. In addition, the transconductance $g_m$ of each of the bipolar transistors of the transconductance stage is dependent upon the value of the bias current supplied by the current mirror circuit, such that the overall effective transconductance $G_m$ of the tunable transconductance stage is linearly proportional to the bias (mirrored synthesizer control) current.

Since the current-controlled oscillator of the synthesizer's phase locked loop produces an output frequency that is linearly proportional to the oscillator control current and inversely proportional to a reference voltage and a frequency-setting capacitor, then, for a phase locked condition, where the phase locked loop's oscillator frequency is equal to the carrier frequency, the cutoff frequency of the tracking filter will be linearly proportional to the carrier frequency, and effectively independent of absolute processing parameters, and temperature variations.

DETAILED DESCRIPTION

Figure 1:
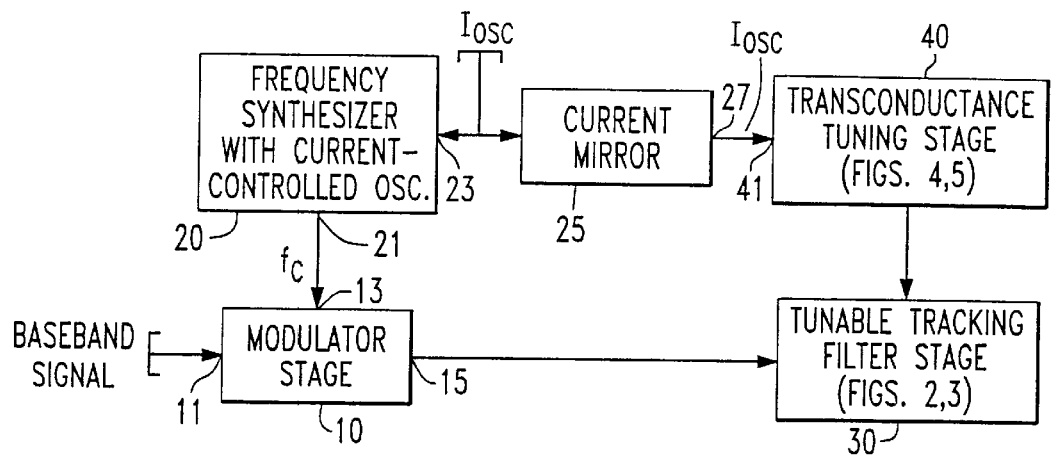
FIG. 1 diagrammatically illustrates the general configuration of a variable carrier frequency communication signal modulator arrangement employing the tracking filter of the present invention.

FIG. 1 diagrammatically illustrates the general configuration of a tracking filter of the present invention and its incorporation into a post-modulator signal path location of a variable carrier frequency communication signal modulator arrangement (such as a quadrature modulator arrangement having in-phase I and quadrature Q channels, as a non-limiting example). A modulator (mixer/multiplier) stage 10 of a respective channel, such as the I channel, has a first input 11, to which a baseband signal of interest is applied, and a second input 13, which is coupled to receive a carrier frequency signal generated at the output 21 of a variable frequency synthesizer 20. Modulator stage 10 also has an output 15, from which the modulated carrier signal of interest is produced. The modulated carrier signal is applied to an input of a variable tracking filter (or tunable tracking filter stage) 30, which is operative to remove the unwanted spurious energy signals from the modulated carrier, as will be described.

Variable frequency synthesizer 20 is of conventional construction, preferably employing a phase locked loop (PLL) having a current-controlled oscillator that produces an output (carrier) frequency $f_c$, which is linearly proportional to a control current $I_{osc}$ applied to a control input 23. Synthesizer 20 may include an emitter-coupled multivibrator, whose output frequency is directly proportional to the control current and inversely proportional to a bandgap or PTAT-based reference voltage (which sets the oscillator output amplitude) and a frequency-setting capacitor. (A non-limiting example of such a synthesizer is described on page 570 of the text: "Bipolar and MOS Analog I.C. Design," by Alan B. Grebene, Wiley Publ. 1984.)

As will be described, the carrier-tracking filter mechanism of the present invention makes use of this frequency synthesizer control current $I_{osc}$ to adjust MOSFET-based resistances for establishing the transconductance properties of a tracking filter transconductance tuning stage 40, which has an input 41 coupled to receive a replica of the control current $I_{osc}$ from a current mirror circuit 25, such that the cutoff frequency $f_o$ of the transconductance-based tracking filter 30 'tracks' the carrier frequency $f_c$ as the carrier frequency $f_c$ is varied in direct linear proportion to the control current $I_{osc}$.

For this purpose, current mirror circuit 25 is coupled in circuit with the current control path of the variable frequency synthesizer 20, so that, in addition to supplying the variable carrier frequency $f_c$ at its output 21 for application to baseband modulator stage 10, variable frequency synthesizer 20 also supplies a replica of the control current $I_{osc}$ at a current mirror output 27 for application to transconductance tuning stage 40.

Figure 2:
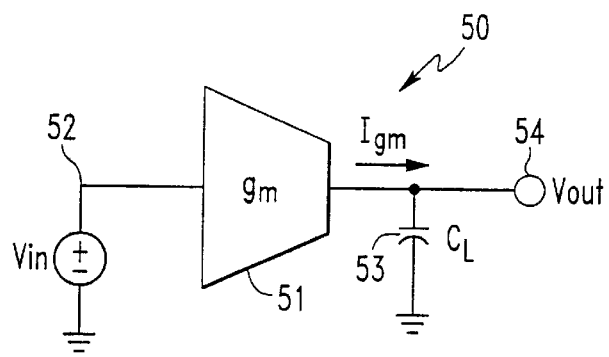
FIG. 2 diagrammatically illustrates a continuous time tunable $g_m/C$ integrator, of the type commonly employed in high frequency telecommunication signal processing integrated circuit architectures.

Tracking filter stage 30 comprises a continuous time filter circuit, in particular a tunable gm/C filter, of the type commonly employed in high frequency telecommunication signal processing integrated circuit architectures. As diagrammatically illustrated in FIG. 2, the fundamental building block of such a tunable $g_m/C$ filter is an integrator stage 50, which is formed of a combination of a transconductance ($g_m$) stage 51 and a load element, in particular an integrating capacitor ($C_L$) 53. The transconductance ($g_m$) stage 51 contains a transconductance element which produces an output current $I_{gm}$, that is proportional to an input control voltage Vin applied to input terminal 52. With the output current $I_{gm}$ of transconductance stage 51 being applied to an output terminal 54, to which the load capacitor ($C_L$) 53 is coupled and from which an output voltage Vout is derived, the transfer function of the integrator stage 50 of FIG. 2 may be expressed as a proportionality of $g_m$ to $C_L$, as by the equation:

$$V_{out}/V_{in} \, g_m/C_L \qquad (1)$$

Figure 3:
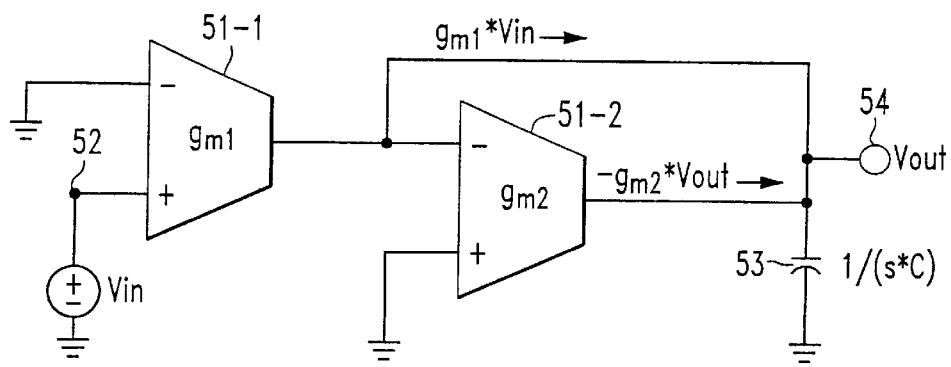
FIG. 3 diagrammatically illustrates a cascaded arrangement of the tunable $g_m/C$ integrator stages of FIG. 2.

By connecting multiple integrators and transconductances, as diagrammatically illustrated at 51-1 and 51-2 in FIG. 3, a transconductance-C ($g_mC$) filter of a desired order may be realized, having a cutoff frequency $f_o$ that is effectively proportional to the ratio of $g_m$ to C.

Namely, $$f_o \sim g_m/C \tag{2}$$

Figure 4:
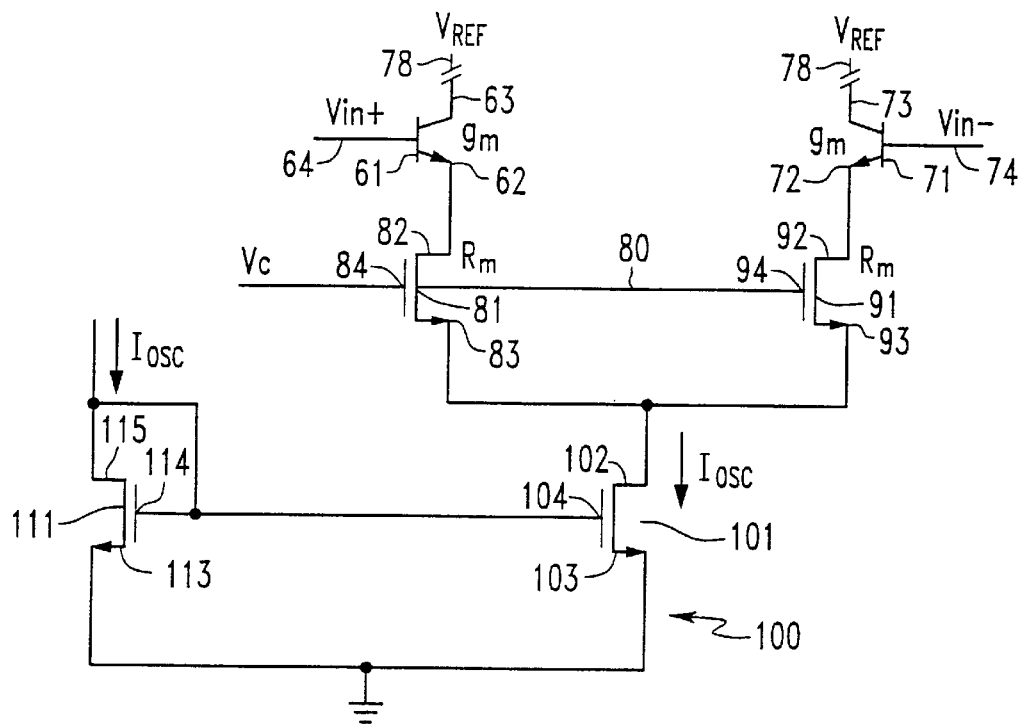
FIG. 4 diagrammatically illustrates a tunable transconductance stage of the tracking filter of the present invention.

By using the circuitry of FIG. 4, to be described, to implement the transconductance tuning stage 40 of FIG. 1, the transconductance component $g_m$ can be tuned in relation to the control current $I_{osc}$ employed to establish the carrier frequency $f_c$ of the variable frequency synthesizer 20, such that the filter's cutoff frequency is proportional to or linearly tracks variations in the control current $I_{osc}$.

More particularly, the tunable transconductance stage of FIG. 4 is comprised of a matched differential bipolar transistor pair comprised of a first bipolar (NPN) transistor 61 and a second bipolar (NPN) transistor 71, each of which has an effective transconductance of $g_m$. Bipolar transistors 61 and 71 have their respective emitters 62 and 72 coupled to first and second controlled (emitter degeneration) resistors, shown as MOSFET transistors 81 and 91. The respective collectors 63 and 73 of the first and second bipolar transistors 61 and 71 are coupled to a reference voltage rail 78, while their respective base electrodes 64 and 74 are coupled to receive complementary input voltages Vin+ and Vin−, that are centered around a common mode reference voltage level Vcm.

MOSFET transistors 81 and 91, which are operated in the linear portion of their $V_{DS}$–$I_{DS}$ characteristic to provide the intended controlled resistance characteristics to be described, have their drain electrodes 82 and 92 respectively coupled in circuit with the emitters 62 and 72 of transistors 61 and 71, and their source electrodes 83 and 93 coupled in common to the drain electrode 102 of MOSFET 101 of a current mirror circuit 100. The gate electrodes 84 and 94 of respective MOSFETs 81 and 91 are coupled in common to a control voltage line 80, to which a control voltage Vc is applied from the transconductance tuning network of FIG. 5, to be described.

Current mirror circuit 100 includes a further MOSFET 111 having its source electrode 113 connected in common with the source electrode 103 of MOSFET 101. The respective gate electrodes 104 and 114 of MOSFETs 101 and 111 are coupled in common with the drain electrode 115 of MOSFET 111, to which the control current $I_{osc}$ for frequency synthesizer 20 is applied. With each of the various system components being formed on the same semiconductor chip, so that the geometries of like components matching one another, the commonly connected source electrodes 103 and 113 of respective MOSFETs 101 and 111 are effectively coupled to the same current source $I_{osc}$ as is employed to set the output frequency of synthesizer 20.

As noted above, the control voltage Vc is produced from the tuning network of FIG. 5, which comprises a servo-loop connected, differential amplifier 120 having first (+) and second (−) inputs 121 and 122, respectively and an output 123 (from which the control voltage Vc is derived, as will be explained). The first input 121 of differential amplifier 120 is coupled to a node 131 between fixed current ($I_f$) source 130 and a reference resistor 132, having a reference resistor value of $R_0$ coupled in circuit with the emitter 142 of a bipolar (NPN) transistor 140.

As a non-limiting example, the fixed current source 130 may comprise a PTAT-based current source for temperature independence, or a bandgap-based reference current source, with the value of $I_f$ defined as:

$$I_f = V_{bg}/R_{set}, \tag{3}$$

where $V_{bg}$ is a bandgap voltage (on the order of 1.25 volts), and $R_{set}$ is a current-setting resistor comprised of the same resistor material as, and therefore effectively identical to the sheet resistivity of the reference resistor 132.

The second input 122 of the differential amplifier 120 is coupled to a node 151 between a mirrored current source 150, which supplies a current $I_{osc}/2$, having a magnitude that is half that of the oscillator control current $I_{osc}$, and the source electrode 152 of a controlled MOSFET-implemented resistor 153, coupled in circuit with the emitter 162 of a bipolar (NPN) transistor 160.

Bipolar transistors 140 and 160, being formed in the same integrated circuit chip as the tunable transconductance stage of FIG. 4, are matched with bipolar transistors 61 and 71, and have their respective base electrodes 144 and 164 supplied with the common mode input voltage level Vcm, referenced above, via control lead 149. The respective collector electrodes 143 and 163 are coupled to a Vcc supply rail 168.

The controlled MOSFET-implemented resistor 153 is configured identically to MOSFETs 101 and 111 of the tunable transconductance stage of FIG. 4, and has its gate electrode 154 coupled to receive the control voltage $V_c$ at the output 123 of differential amplifier 120. The drain electrode 155 of MOSFET resistor 153 is coupled to the emitter 162 of bipolar transistor 160.

In operation, with a fixed current $I_f$ being supplied by way of current source 130 through reference resistor 132, and with a mirrored current $I_{osc}/2$ being supplied by way of current source 150 through MOSFET resistor 153, for a balanced servo loop condition, the two input voltages supplied to the respective inputs 121 and 122 of differential amplifier 120 are equal. Namely, $$R_m * I_{osc}/2 = R_0 * I_f \tag{4}$$

From equation (4), the resistor value $R_m$ of controlled MOSFET resistor 153 can be written as:

$$R_m = R_0 * 2I_f/I_{osc} \tag{5}$$

Substituting the value of $I_f$ from equation (3), the value of $R_m$ can be expressed as:

$$R_m = k_0/I_{osc} \tag{6}$$

where $k_0 = 2V_{bg} * (R_0/R_{set})$ and is essentially a constant, since it is proportional to the product of a fixed bandgap voltage and the ratio of resistors of the same wafer material.

Thus, equation (6) reveals that the controlled resistance $R_m$ of each of MOSFETs 101 and 111 in the tunable transconductance stage of FIG. 4 is inversely proportional to the frequency synthesizer control current $I_{osc}$.

The overall effective transconductance $G_m$ of the differential pair-implemented tunable transconductance stage of FIG. 4 is given by the expression:

$$G_m = 2g_m/(2 + 2g_m R_m) \tag{7}$$

The transconductance $g_m$ of each of bipolar transistors 61 and 71 is dependent upon the value of the bias current $I_{osc}$ supplied by current mirror circuit 100, such that $$g_m = (q/kT)*(I_{osc}/2) \quad (8)$$

By combining equations (6), (7) and (8), the overall effective transconductance $G_m$ of the tunable transconductance stage of FIG. 4 can be expressed as $$G_m = (qI_{osc}/kT)/(2+(q/k_0)/kT), \quad (9)$$

which reveals that $G_m$ is linearly proportional to the bias current $I_{osc}$.

As noted earlier, in the frequency synthesizer 20 of FIG. 1, the current-controlled oscillator of the synthesizer's PLL may employ an emitter-coupled multivibrator, whose output frequency is linearly proportional to the control current ($I_{osc}$) and inversely proportional to a bandgap based reference voltage ($V_{ref}$) and a frequency-setting capacitor ($C_o$).

From the above-referenced Grebene text, the oscillator output frequency $f_{osc}$ may be written as:

$$f_{osc} = I_{osc}/4V_{ref}C_o \quad (10)$$

For a phase locked condition, where the PLL oscillator frequency $f_{osc}$ is equal to the carrier frequency $f_c$, the required oscillator control current $I_{osc}$ in equation (10) thus becomes:

$$I_{osc} = 4V_{ref}f_cC_o \quad (11)$$

Combining equations (2), (9) and (11) to derive an expression for the cutoff frequency $f_o$ yields:

$$f_o\, G_m/C = (4V_{ref}f_c(q/kT)C_o/C)/(2+qk_o/kT) \quad (12)$$

Thus, with the exception of T and $f_c$, all the terms in equation (12) are constants. The temperature-dependency term T can be readily eliminated by using a PTAT-based current source as the current source 130 in the tuning circuit of FIG. 5 (instead of a bandgap source used to simplify the derivation). Equation (12) thus becomes:

$$f_o K_1 * f_c * (C_o/C), \quad (13)$$

where $K_1$ is a constant proportional to $V_{ref}$ and independent of temperature.

Figure 5:
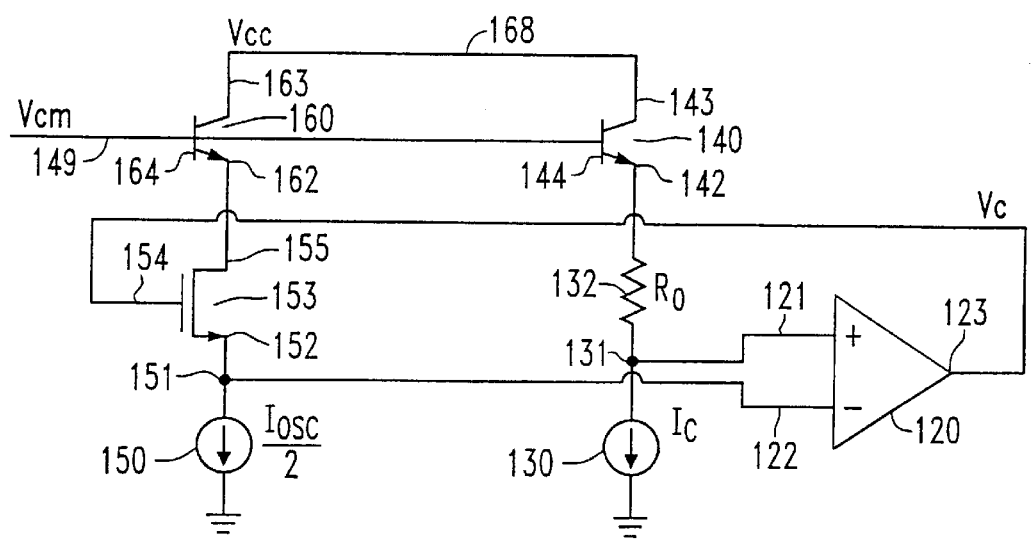
FIG. 5 diagrammatically illustrates a tuning network for tuning the tunable transconductance stage of the tracking filter of the present invention.

This establishes that the cutoff frequency $f_o$ of a transconductance stage-based tracking filter of the invention, comprised of the tunable transconductance stage of FIG. 4 and the tuning network of FIG. 5, is effectively independent of process parameters (other than geometry ratios of like (matched) components, as described above), independent of temperature, and is linearly proportional to the carrier frequency $f_c$.

As will be appreciated from the foregoing description, the impracticality of attempting to implement a spurious energy suppression filter as an unacceptably large order noise suppression filter for a data communication system is successfully addressed by the post-mixer tracking filter of the present invention, configured as a current-controlled MOSFET-implemented resistance for a transconductance-capacitance filter and an associated transconductance tuning stage, with the MOSFET-implemented resistance being controlled by the same control current that establishes the output frequency. As a consequence, the cut-off frequency of the filter effectively tracks the carrier, and effectively independent of absolute processing parameters and temperature.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. For use with a communication device having a signal modulator that is adapted to modulate a signal in accordance with an output frequency coupled thereto by a current-controlled oscillator which is adapted to generate said output frequency in accordance with a control current applied thereto, and a frequency-tracking filter circuit coupled to the output of said signal modulator, the improvement wherein said frequency-tracking filter circuit has a cut-off frequency that is linearly proportional to said control current.

2. The improvement according to claim 1, wherein said frequency-tracking filter circuit comprises a transconductance tuning stage coupled to receive said control current, and a transconductance-containing filter stage coupled to said transconductance tuning stage.

3. The improvement according to claim 2, wherein said transconductance-containing filter stage comprises a tunable $g_m/C$ filter, having a tunable transconductance ($g_m$) stage and an integrating capacitor C coupled therewith, such that said tunable $g_m/C$ filter has a cutoff frequency $f_o$ proportional to the ratio of $g_m$ to C.

4. The improvement according to claim 3, wherein said transconductance tuning stage is referenced to a current mirror circuit, which replicates said control current.

5. The improvement according to claim 4, wherein said transconductance tuning stage includes a differentially connected pair of transistors, each having an effective transconductance $g_m$, and being coupled in circuit with a respective controlled MOSFET-implemented resistance, which is coupled to receive a control input.

6. The improvement according to claim 5, wherein each MOSFET-implemented resistance is operated in the linear portion of its $V_{DS}-T_{DS}$ characteristic.

7. The improvement according to claim 5, wherein each MOSFET-implemented resistance has a controlled resistance that is inversely proportional to said control current.

8. A current controlled filter circuit comprising:
   a filter stage containing a tunable transconductance that is adapted to establish a cut-off frequency of said filter stage; and
   a transconductance tuning stage coupled to said filter stage; and wherein
   said filter stage and said transconductance tuning stage are configured such that said cut-off frequency of said filter stage is linearly proportional to a control current applied to said transconductance tuning stage.

9. The current controlled filter circuit according to claim 8, wherein said filter stage comprises a tunable $g_m/C$ filter, having a tunable transconductance ($g_m$) stage and an integrating capacitor C coupled therewith, such that said tunable $g_m/C$ filter has a cutoff frequency $f_o$ proportional to the ratio of $g_m$ to C.

10. The current controlled filter circuit according to claim 9, wherein said transconductance tuning stage is referenced to a current mirror circuit, which replicates said control current.

11. The current controlled filter circuit according to claim 10, wherein said transconductance tuning stage includes a differentially connected pair of transistors, each having an effective transconductance $g_m$, and being coupled in circuit with a respective controlled MOSFET-implemented resistance, which is coupled to receive a control input, and wherein each each MOSFET-implemented resistance is operated in the linear portion of its $V_{DS}$–$I_{DS}$ characteristic.

12. The current controlled filter circuit according to claim 11, wherein each MOSFET-implemented resistance has a controlled resistance that is inversely proportional to said control current.

13. A signal processing circuit according to claim 11, wherein said tunable transconductance and said transconductance ($g_m$) stage are interconnected such that said tunable $g_m$/C filter has a cut-off frequency that is linearly proportional to said control current.

14. For use with a communication device having a signal modulator adapted to modulate a signal in accordance with an output frequency coupled thereto by a current-controlled oscillator, which is adapted to generate said output frequency in accordance with a control current applied thereto, a method of filtering the output of said signal modulator comprising the steps of:

(a) coupling to the output of said signal modulator a frequency-tracking filter circuit having a cut-off frequency that is linearly proportional to said control current; and (b) controlling said cut-off frequency of said frequency-tracking filter circuit in linear proportion to said control current.

15. The method according to claim 14, wherein said frequency-tracking filter circuit includes a transconductance tuning stage coupled to receive said control current, and a transconductance-containing filter stage coupled to said transconductance tuning stage.

16. The method according to claim 15, wherein said transconductance-containing filter stage comprises a tunable $g_m$/C filter, having a tunable transconductance ($g_m$) stage and an integrating capacitor C coupled therewith, such that said tunable $g_m$/C filter has a cutoff frequency $f_o$ proportional to the ratio of $g_m$ to C.

17. The method according to claim 16, wherein said transconductance tuning stage is referenced to a current mirror circuit, which replicates said control current.

18. The method according to claim 17, wherein said transconductance tuning stage includes a differentially connected pair of transistors, each having an effective transconductance $g_m$, and being coupled in circuit with a respective controlled MOSFET-implemented resistance, which is coupled to receive a control input.

19. The method according to claim 18, wherein each MOSFET-implemented resistance is operated in the linear portion of its $V_{DS}$–$I_{DS}$ characteristic.

20. The method according to claim 18, wherein each MOSFET-implemented resistance has a controlled resistance that is inversely proportional to said control current.

* * * * *